United States Patent
Couble et al.

(10) Patent No.: US 6,565,731 B1
(45) Date of Patent: May 20, 2003

(54) ELECTROPLATING PROCESS

(75) Inventors: Edward C. Couble, Brockton, MA (US); Mark J. Kapeckas, Marlborough, MA (US); Steven M. Florio, Hopkinton, MA (US); David L. Jacques, Northbridge, MA (US)

(73) Assignee: Shipley Company, L.L.C., Marlborough, MA (US)

( * ) Notice: Subject to any disclaimer, the term of this patent is extended or adjusted under 35 U.S.C. 154(b) by 850 days.

(21) Appl. No.: 08/868,092

(22) Filed: Jun. 3, 1997

(51) Int. Cl.[7] ............................. H05K 3/00; C25D 5/54; C25D 5/56
(52) U.S. Cl. ................... 205/125; 205/159; 205/164
(58) Field of Search ............................. 205/125, 159, 205/164, 210

(56) References Cited

U.S. PATENT DOCUMENTS

| | | | | |
|---|---|---|---|---|
| 3,674,711 A | * | 7/1972 | Growald et al. ............ 252/500 |
| 3,962,497 A | * | 6/1976 | Doty et al. ................ 427/306 |
| 4,309,247 A | * | 1/1982 | Hou et al. .................. 162/149 |
| 4,515,829 A | | 5/1985 | Deckert et al. .............. 427/97 |
| 4,619,741 A | | 10/1986 | Minten et al. ............... 204/15 |
| 4,701,350 A | | 10/1987 | Lindsay ..................... 427/97 |
| 5,015,339 A | * | 5/1991 | Pendleton ................... 204/15 |
| 5,143,592 A | * | 9/1992 | Toro ........................ 205/210 |
| 5,611,905 A | | 3/1997 | Florio et al. ............... 205/109 |
| 5,683,565 A | * | 11/1997 | Florio et al. ............... 205/109 |

FOREIGN PATENT DOCUMENTS

GB    1 338 491    11/1973

* cited by examiner

*Primary Examiner*—Edna Wong
(74) *Attorney, Agent, or Firm*—S. Matthew Cairns; Peter F. Corless

(57) ABSTRACT

A process for electroplating a substrate by coating the substrate with a coating of conductive particles. The process is characterized by a pretreatment sequence that includes contact of the substrate with a single solution containing a reducing agent and a polyelectrolyte. The use of the single solution decreases the incidence of interconnect defects in printed circuit manufacture.

9 Claims, 3 Drawing Sheets

ELECTROPLATING PROCESS

BACKGROUND OF THE INVENTION

1. Introduction

This invention relates to a process for fabrication of printed circuit boards. More particularly, this invention relates to a metallization process for printed circuit board manufacture using a carbonaceous coating as a conductive layer for direct electroplating. More specifically, this invention has for its object a direct plate process involving fewer processing steps which process provides a printed circuit board exhibiting a significantly reduced incidence of interconnect defects.

2. Description of the Prior Art

Nonconducting surfaces are conventionally metallized by a sequence of steps comprising catalysis of the surface of the nonconductor to render the same catalytic to electroless metal deposition followed by contact of the catalyzed surface with an electroless plating solution that deposits metal over the catalyzed surface in the absence of an external source of electricity. Metal plating continues for a time sufficient to form a metal deposit of the desired thickness. Following electroless metal deposition, the electroless metal deposit is optionally enhanced by electrodeposition of metal over the electroless metal coating to a desired thickness. Electrolytic deposition is possible because the electroless metal deposit serves as a conductive coating that permits electroplating.

Catalyst compositions useful for electroless metal plating are known in the art and disclosed in numerous publications including U.S. Pat. No. 3,011,920, incorporated herein by reference. The catalyst of this patent consists of an aqueous suspension of a tin/noble catalytic metal colloid. A surface treated with such a catalyst promotes the generation of an electrolessly formed metal deposit by the oxidation of a reducing agent in an electroless plating solution catalyzed by the catalytic colloid.

Electroless plating solutions are aqueous solutions containing both a dissolved metal and a reducing agent in solution. The presence of the dissolved metal and reducing agent together in solution results in plate out of the metal in contact with a catalytic metal tin catalyst. However, the presence of the dissolved metal and reducing agent together in solution may also result in solution instability and indiscriminate deposition of metal on the walls of containers for such plating solutions. This may necessitate interruption of the plating operation, removal of the plating solution from the tank and cleaning of tank walls and bottoms by means of an etching operation. Indiscriminate deposition may be avoided by careful control of the plating solution during use and by use of stabilizers in solution which inhibit indiscriminate deposition, but also retard plating rate.

Attempts have been made in the past to avoid the use of an electroless plating solution by a direct plating process whereby a metal may be deposited directly over a treated nonconducting surface. One such process is disclosed in U.S. Pat. No. 3,099,608, incorporated herein by reference. The process disclosed in this patent involves treatment of the nonconductive surface with a tin-palladium colloid which forms an essentially nonconductive film of colloidal palladium particles over the nonconducting surface. This may be the same tin-palladium colloid used as a plating catalyst for electroless metal deposition. For reasons not fully understood, it is possible to electroplate directly over the catalyzed surface of the nonconductor from an electroplating solution though deposition occurs by propagation and growth from a conductive surface. Therefore, deposition begins at the interface of a conductive surface and the catalyzed nonconductive surface. The deposit grows epitaxially along the catalyzed surface from this interface. For this reason, metal deposition onto the substrate using this process is slow. Moreover, deposit thickness is uneven with the thickest deposit occurring at the interface with the conductive surface and the thinnest deposit occurring at a point most remote from the interface.

An improvement in the process of U.S. Pat. No. 3,099,608 is described in U.K Patent No. 2,123,036 B, incorporated herein by reference. In accordance with the process described in this patent, following catalysis, a surface is electroplated from an electroplating solution containing an additive that is said to inhibit deposition of metal on the metal surface formed by plating without inhibiting deposition on the metallic sites over the nonconductive surface. In this way, there is said to be preferential deposition over the metallic sites with a concomitant increase in the overall plating rate. In accordance with this patent, the metallic sites are preferably formed in the same manner as in the aforesaid U.S. Pat. No. 3,099,608—i.e., by immersion of the nonconductive surface in a solution of a tin-palladium colloid. The additive in the electroplating solution responsible for inhibiting deposition is described as one selected from a group of dyes, surfactants, chelating agents, brighteners and leveling agents. Many of such materials are conventional additives for electroplating solutions.

There are limitations to the above process. Both the processes of the U.S. and U.K. patents for electroplating require conductive surfaces for initiation and propagation of the electroplated metal deposit. For this reason, the processes are limited in their application to metal plating solutions of nonconducting substrates in areas in close proximity to a conductive surface. In addition, in practice it has been found that the surface provided with metallic sites is not robust and does not stand up to those chemical treatment compositions used prior to the step of electroplating. For this reason, when the process is used for the manufacture of printed circuit boards, void formation is a significant problem resulting in rejection of circuit boards manufactured by the process.

Improvements in processes for direct electroplating of nonconductors overcoming the deficiencies in the processes disclosed in U.S. Pat. No. 3,099,608 and in U.K. Pat. No. 2,123,036 are known. One such process is disclosed in U.S. Pat. Nos. 4,895,739; 4,919,768; 4,952,286; and 5,276,290, each incorporated herein by reference. In accordance with the processes of these patents, an electroless plating catalyst, such as that disclosed in the above referenced U.K. patent, is treated with an aqueous solution of a chalcogen, such as a sulfur solution, to convert the catalyst surface to a chalcogenide surface. By conversion of the surface to the chalcogenide conversion coating, the coating formed is both more robust and more conductive and electroless plating catalyst does not desorb from the surface during metallization. Consequently, in accordance with the process of said patents, it is possible to form printed circuit boards using formulations that would otherwise attack the catalyst layer such as those solutions used in pattern plating processes.

The processes of the aforementioned patents provide a substantial improvement over the process of the U.K. patent. However, it has also been found that treatment of an absorbed catalytic metal on a substrate having both nonconducting portions and metallic portions, such as a printed circuit board substrate, with a sulfide solution results in a formation of a sulfide on metal surfaces in contact with the solution of the sulfide precursor solution. Therefore, if the process is used in the manufacture of printed circuit boards, both the catalytic metal and the copper cladding or conductors of the printed circuit board base material are converted into a tenaciously adherent sulfide. If the copper sulfide is not removed prior to electroplating, it may reduce the bond strength between the copper and a subsequently deposited metal over the copper.

An alternative method for direct electroplating of nonconductors is disclosed in U.S. Pat. No. 4,619,741 incorporated herein by reference. In accordance with the procedures of this patent, a nonconductive substrate is coated with a dispersion of carbon black and then dried. The coating is removed from copper surfaces where coating residues are undesired and the remaining portions of the substrate are plated using procedures similar to those described in the aforesaid references. There are several problems inherent in this procedure. For example, carbon black is a poor conductor of electricity and consequently, before forming the carbon black dispersion, in practice, it is believed that the carbon black particles must be treated with an organic ionomer or polymer to enhance conductivity. In addition, during processing and prior to electroplating, the coating formed from the carbon black dispersion is only poorly adherent to the underlying substrate and has a tendency to flake off of the substrate prior to the plating step. This results in void formation during plating. In addition, because of the poor adhesion of the coating to the substrate, subsequent to plating, there is a tendency for the metal deposit to separate from the substrate. This can lead to interconnect defects between a metallized hole and an innerlayer in multilayer printed circuit fabrication. Finally, carbon black is suspected to be carcinogenic to humans.

A more recently utilized direct plate process for metallizing the walls of hole-walls employs dispersions of graphite for the formation of a conductive coating. The use of graphite to form conductive coatings on through-hole walls is known and disclosed in U.S. Pat. No. 2,897,409 incorporated herein by reference. Current processes are disclosed, for example, in U.S. Pat. Nos. 4,619,741; 5,389,270 and 5,611,905, each incorporated herein by reference. In accordance with procedures described in these patents, a dispersion of carbon black or graphite is passed through the through-holes to form a coating of the dispersion on the through hole-walls. The coating is dried to yield a conductive layer of the carbon black or graphite which is sufficiently conductive for electroplating in a conventional manner.

The above processes find substantial use in processes for the manufacture of double sided and multilayer printed circuit boards. A typical process for the manufacture of a multilayer printed circuit board using graphite coatings, excluding water rinses, includes the steps of solvent pretreatment to soften the epoxy circuit board substrate, treatment with an oxidizing agent such as a permanganate solution to form a porous structure and to activate the surface of the epoxy substrate, treatment with a neutralizer to remove permanganate residue, an optional treatment step with a glass etchant, treatment with a solution of a charge modifier to cause adsorption of a subsequently applied graphite layer, formation of the graphite layer by immersion of the substrate in an aqueous graphite dispersion, several drying steps to bond the graphite coating to the epoxy surface, treatment with a microetchant to remove graphite from copper surfaces without removing the same from epoxy surfaces, pattern formation and plating. The overall process is unduly long in the number of processing steps. In addition, it has been found that the process results in a significant number of interconnect defects (ICDs) and voids in the finished circuit resulting in disposal or reworking of the boards containing these defects.

It would be highly desirable to develop a process that reduces the number of processing steps and further reduces the incidence of interconnect and coverage defects. In particular, it would be highly desirable to reduce the incidence of these defects while reducing the overall processing sequence.

SUMMARY OF THE INVENTION

The present invention is directed to an improved process for the direct electroplating of a printed circuit board substrate using a dispersion of carbon black or graphite particles, hereinafter referred to collectively as a carbonaceous coating or a carbonaceous dispersion as the context so requires. In accordance with the invention, following treatment with a permanganate solution and before formation of a carbonaceous coating, a single treatment solution is used to replace prior art solutions used to neutralize and remove permanganate residue and charge modify the surface of a circuit board substrate. The single solution contains a hydroxyl substituted lower molecular weight amine, a polyelectrolyte and an organic acid.

Though the subject invention provides the advantage of combining several treatment solutions into a single solution thereby reducing the number of processing steps, for reasons not fully understood, the invention also significantly reduces the incidence of interconnect defects and voids in circuit manufacture.

DESCRIPTION OF THE PREFERRED EMBODIMENTS

Figure 1:
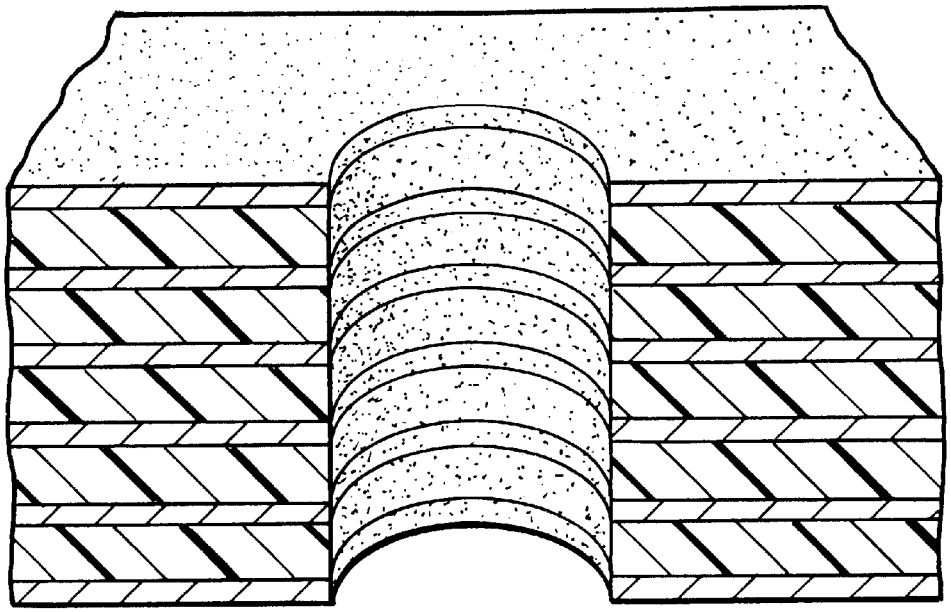
FIG. 1 illustrates a hole wall coated with a carbonaceous coating immediately following formation of the coating.

The subject invention is suitable for the manufacture of a variety of commercial articles where a metal deposit is desired over the surface of a nonconductor. However, the invention is especially useful for fabrication of printed circuit boards having copper cladding over at least one A surface of a printed circuit board substrate. For this reason, the description that follows is directed primarily to printed circuit board manufacture.

In printed circuit board manufacture, the substrate commonly used is an epoxy substrate filled with glass fibers and copper clad on at least one of its surfaces, or for multilayer circuit manufacture, an innerlayer clad with copper. As is known in the art, the epoxy can be mixed with other resins and glass fibers for specific purposes. Other circuit board substrates include polyimide, Teflon and flex films such as films of Mylar.

In processes for the manufacture of a double-sided printed circuit board using a carbonaceous conductive coating, a first step comprises the formation of through-holes by drilling or punching or any other method known to the art. These holes are subsequently metallized to provide conductive pathways between circuit layers. Likewise, in the manufacture of a multilayered circuit board using a carbonaceous conductive coating, one step comprises formation of vias that are subsequently metallized to provide conductive pathways between circuit layers comprising the multilayer stack. Following formation of the holes or vias, it is desirable to employ the conventional steps of rinsing with an organic solution to clean and degrease the board and soften the walls of the holes or vias. Suitable organic solutions are oxygenated epoxy solvents such as those disclosed in U.S. Pat. No. 4,515,829 incorporated herein by reference. Such solvents include acetone, methylethyl ketone, methylcellosolve butyl carbitol, Butyl Carbitol acetate and butly cellosolve.

Following treatment with a solvent, the hole walls are desmeared. Typical hole wall desmear involves treatment of the walls with sulfuric acid, chromic acid, permanganate, or plasma etching though the commonly used method involves treatment with permanganate. Permanganate solutions used are alkaline having a pH in excess of 11, typically a pH ranging from between 11.5 to 14.0. Permanganate is usedlin an amount of at least 2 grams per liter of solution.

Following desmearing, the circuit board base material may be treated with a glass etchant that removes glass fibers extending into the holes from the hole walls. When the desmear utilizes permanganate, permanganate residues are removed with a solution that neutralizes base residues and dissolves manganate residues. Such solutions typically comprise an acidic peroxide or alkaline amine and a surfactant. Following the. step of neutralization, the hole walls are charge modified to impart a charge to the hole wall opposite to the charge carried by the particles comprising the carbonaceous coating dispersion. The material of choice for the step of charge modification is a polyelectrolyte. Polyelectrolytes are typically polymers having a plurality of charged groups along their chains where the charged groups carry a charge opposite from the charge of a dispersed particle to be adsorbed onto the substrate. Polyelectrolytes used in metal plating procedures are disclosed in numerous publications including U.K. Pat. No. 1,338,491 and U.S. Pat. Nos. 4,478,883; 4,554,182; 4,701,350 and 4,969,979, each incorporated herein by reference.

In accordance with the subject invention, the steps of neutralization and charge modification are combined into a single step. Suitable reducing agents are disclosed in U.K. Patent Application 2,134,140A incorporated herein by reference and in the above referenced U.S. Pat. No. 4,515,829. Suitable reducing agents include stannous ions as provided in acidified stannous chloride solutions, bisulfite ions, hydroxylamines such as hydroxylamine chloride and hydroxylamine nitrate, formaldehyde, sugar, etc. The preferred reducing agent is a hydroxylamine such as hydroxylamine nitrate used in a concentration of from about 1 to 100 grams per liter of solution and preferably, within a range of from 5 to 50 grams per liter.

In addition to the reducing agent, the single treatment solution also includes a polyelectrolyte. A polyelectrolyte is a macromolecular compound which, when dissolved in a suitable polar solvent, generally water, spontaneously acquires or can be made to acquire a large number of elementary charges distributed along its macromolecular chain. The use of polyelectrolytes in plating process is disclosed in the above referenced patents and in particular, U.S. Pat. Nos. 4,478,883 and 4,701,350. The polylectrolyte used in the composition of the invention is water soluble, and preferably contains a cationic group such as a quaternary phosphonium or quaternary ammonium group. Such materials are commercially known. The Reten polymers from Hercules Incorporated are suitable materials. The concentration of the polyelectrolyte may vary within broad limits and preferably varies between about 1 and 150 grams per liter and more preferably, between about 5 and 40 grams per liter. Preferred polyelectrolytes are polyquaternary amines.

The third component of the formulation comprises an acid. Though weaker mineral acids may be used such as sulfuric acid and phosphoric acid, preferably the acid is an organic acid, more preferably a sulfonic acid and most preferably, a lower molecular weight alkyl sulfonic acid such as methane sulfonic acid, ethane sulfonic acid, etc. The sulfonic acid is used in an amount of from 20 to 150 grams per liter and more preferably, in an amount of from 50 to 100 grams per liter. In general, the amount of the acid is sufficient to provide a composition having a pH between 0 and 2.5 and preferably, between about 0.2 and 2.5.

An optional ingredient in the formulation is a surfactant. Suitable surfactants include Triton X-100 ortriton X-102, sold by Rohm and Haas Co., Philadelphia, Pa.; Fluorad® FC-120, FC-430, FC-431, FC-129, and FC-135 anionic fluorochemical surfactants; sold by Minnesota Mining & Manufacturing Co., St. Paul, Minn.; Darvan No. 1, sold by R. T. Vanderbilt Co.; Eccowet L F, sold by Eastern Color and Chemical; Petro ULF, sold by Petro Chemical Co. Inc.; Polytergent B-Series surfactants, sold by Olin Corporation. Additional surfactants are disclosed in the above cited patents. The surfactant may be used in a concentration of from 1 to 50 grams per liter and more preferably, within a concentration of from 2 to 25 grams per liter.

An optional additive in the formulation of the invention is a glass etchant to remove glass fibers protruding into the interior of the through-holes following desmear. Any known glass etchant may be used. A preferred glass etchant is ammonium bifluoride in an amount of from 1 to 25 grams per liter of solution.

The single solution described above may be used in either vertical or horizontal processing procedures. It is preferably used at elevated temperatures and temperatures within the range of from 25 to 80° C. are suitable, temperatures of from 40 to 50° C. being more preferred. The solution may be applied to a substrate by immersion or spraying or any other means known to the art. If by immersion, the substrate to be treated is immersed in the solution for a time varying between 1 and 10 minutes and preferably for a time varying between 3 and 8 minutes. If by spraying, the time can be shortened to from ½ to 1 minute. Preferably, spraying is accomplished using submerged spray bars to prevent foaming.

The process of the invention using the single treatment solution described above provides the advantage of reducing the number of plating steps in a plating sequence. However, the process additionally provides unexpected advantages. One such advantage is an improved consistency of throwing power. More importantly, the process of the invention produces finished circuit boards with a significantly reduced incidence of interconnect defects and voids. As is known in the art, an interconnect defect is a separation failure between copper foil and plated copper within a hole wall due to inadequate bond between the copper foil cross section within the hole and plated copper. The failure may be due to residue left on the surface of the copper foil during processing.

Figure 2:
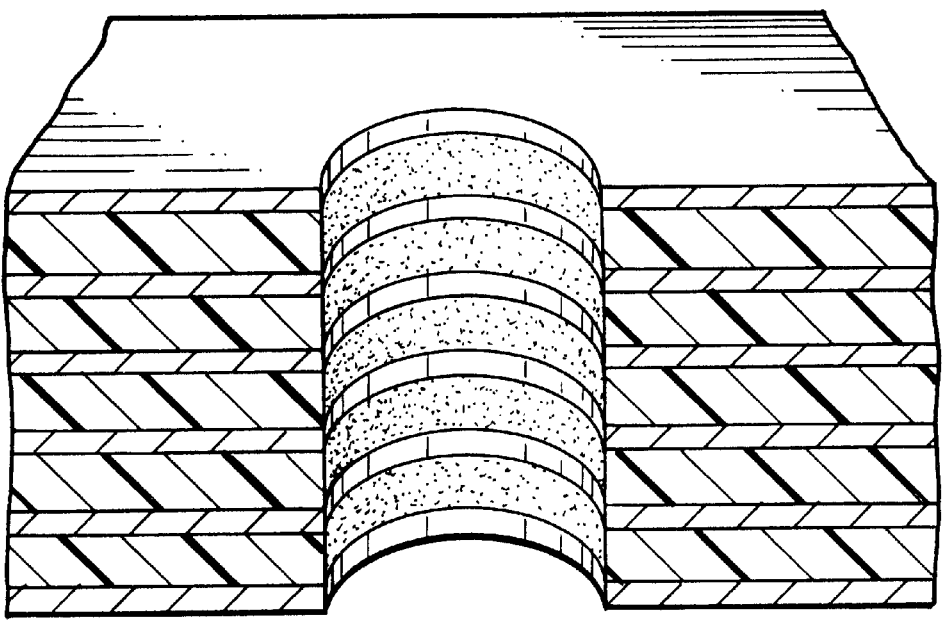
FIG. 2 illustrates a hole wall which has been properly treated to remove the carbonaceous coating from copper foil exposed within the hole.
Figure 3:
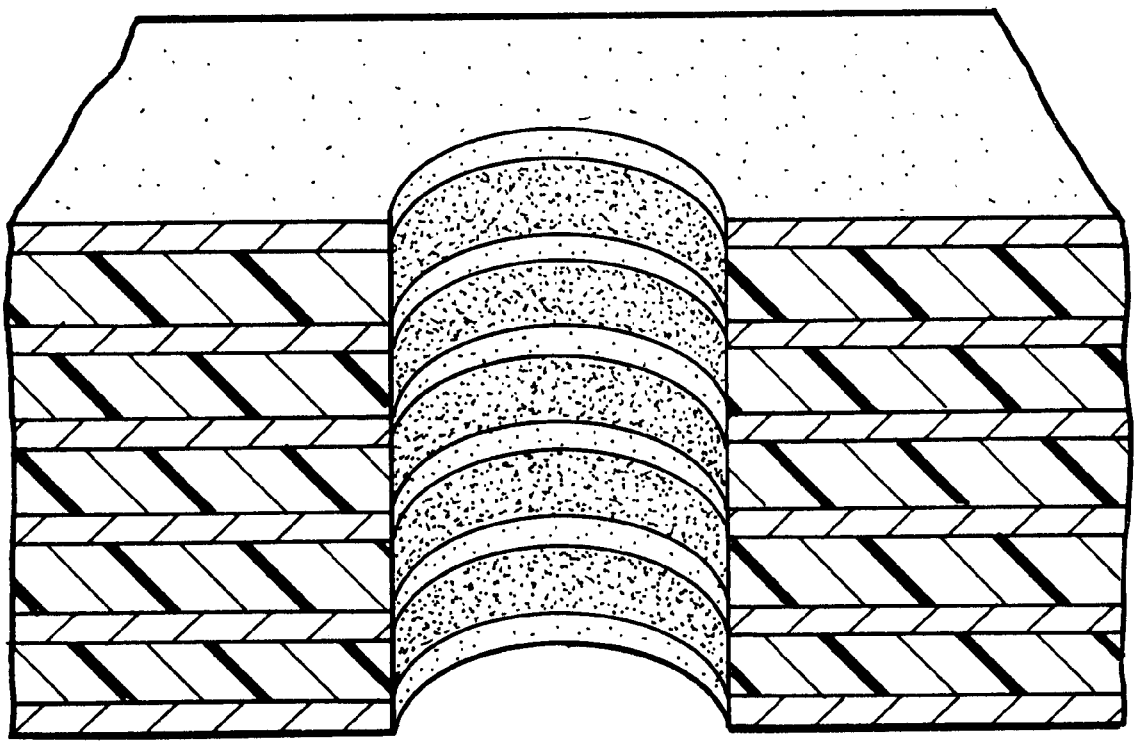
FIG. 3 illustrates inadequate removal carbonaceous coating from a hole wall.

Interconnect failures can be observed by cross-sectioning a board and microscopy. A cause of interconnect defect is figuratively represented in FIGS. 1 through 3 of the drawings. In FIG. 1 of the drawings, a representation of a cross section of a multilayer board 1 is shown having via or through hole 2. The stack comprises a top copper clad layer 3, interconnect copper foils 4 separated by dielectric such as epoxy layers 5, and coated by carbonaceous coating 6. In FIG. 1, the carbonaceous coating is on the surface of copper cladding 3 and on the interface of copper foils 4 and dielectric surfaces 5 within the hole wall. FIG. 2 of the drawings illustrates a hole wall where the carbonaceous coating is properly removed. In FIG. 2, it can be seen that the carbonaceous coating 6 is intact on the dielectric surfaces 5 but fully removed from the cross section of the copper foil 4 within the hole wall and the surface of the copper cladding 3. Plating of a hole wall treated in this manner should result in elimination of interconnect defects within this hole. FIG. 3 illustrates inadequate removal of carbonaceous coating from the copper surfaces within the hole wall. In FIG. 3, the carbonaceous coating is still intact on the dielectric surface 5, but some residue of the carbonaceous coating 6 remains on the copper foil 4 and the top copper surface 3. Inadequate removal results in the carbonaceous coating remaining between the copper surfaces and a subsequently electrodeposited metal coating. This can lead to an interconnect defect.

Figure 4:
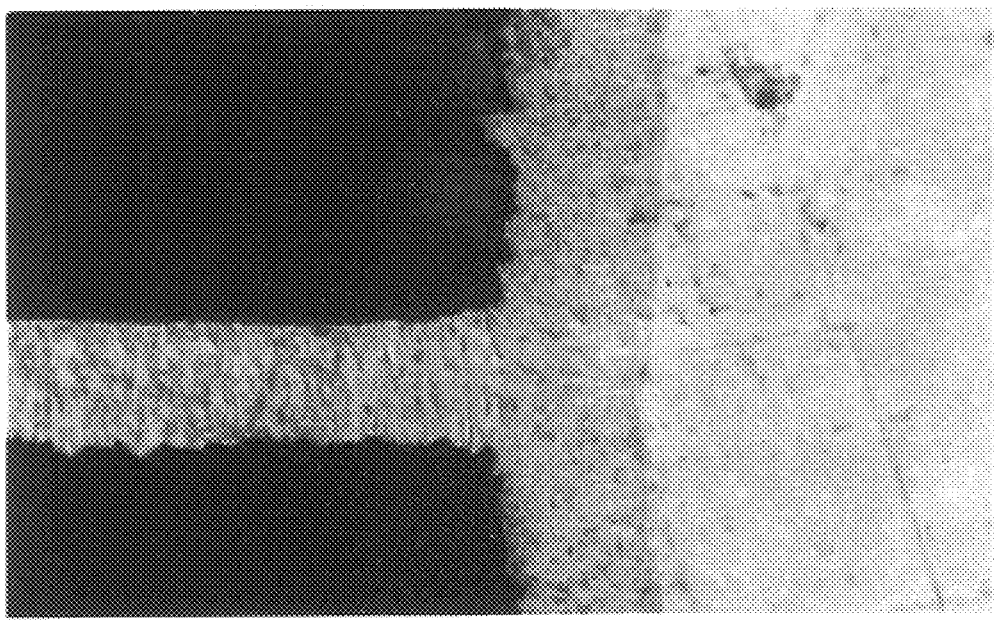
FIG. 4 is a photomicrograph of a through-hole cross section showing a satisfactory bond between copper foil and plated copper.
Figure 5:
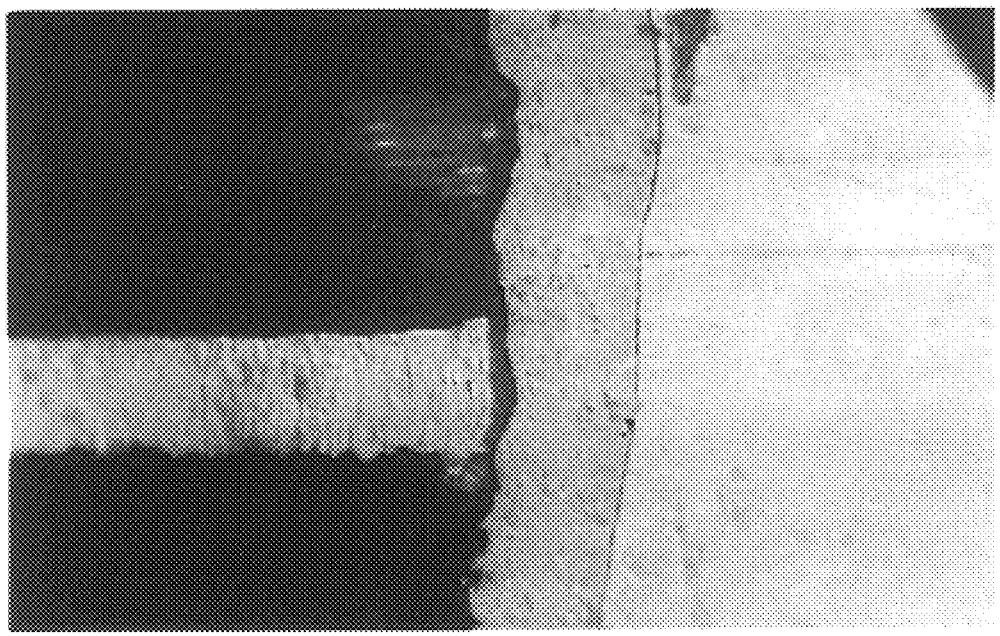
FIG. 5 is a photomicrograph of a through hole cross section showing a poor bond between copper foil and plated copper and a resulting interconnect defect.

FIG. 4 of the drawing is a photomicrograph of the cross section of a through hole and shows proper bond between copper foil and plated copper. FIG. 5 is a photomicrograph showing an interconnect defect such as might result from inadequate removal of the graphite as illustrated in FIG. 3.

It has been found that when the neutralizing solution and conditioning solution are used as separate solutions as in the prior art, the incidence of ICDs may be as high as 30 percent. When the single solution of the invention is used, the incidence of ICDs drops to 2 percent or less and typically less than 1 percent, all other process steps remaining the same.

Following the pretreatment procedures described above, the next step in the process comprises treating the substrate with a carbonaceous dispersion. The particles may be of carbon black (amorphous), graphite (crystalline), or a mixture of the two. The carbonaceous material may be present in the dispersion in an amount of from about 0.1 to about 20% by weight of the dispersion, and preferably in an amount of from about 0.5 to about 10% by weight of the dispersion. The carbon may have a mean particle size within a range of from about 0.05 to about 50 microns, and preferably, is of a particle size within a range of from about 0.1 to 5.0 microns. From the perspective of performance, particles having the smaller dimension are preferred. Graphite particles of suitable size can be prepared by the wet grinding or milling of raw graphite having a particle size greater than 50 microns to form a slurry of smaller particles. Graphite particles of suitable size can also be formed by graphitizing already-small carbon-containing particles.

If a mixture of carbon black and graphite is used, the carbon black may have a substantially smaller particle size than the graphite. The ratio of graphite to carbon black may vary from about 1:100 to about 100:1, and preferably from about 1:10 to about 10:1.

The carbon black used to form a carbonaceous dispersion may be substantially as described in U.S. Pat. No. 5,139,642 incorporated herein by reference. Several commercial carbon blacks contemplated to be useful herein include Cabot Monarch 1300, sold by Cabot Corporation, Boston, Mass.; Cabot XC-72R Conductive, from the same manufacturer; Acheson Electrodag 230, sold by Acheson Colloids Co., Port Huron, Mich.; Columbian Raven 3500, made by Columbian Carbon Co., New York City, N.Y.; and other conductive carbon blacks having similar particle sizes and dispersion characteristics.

The graphite may be substantially as described in U.S. Pat. No. 5,139,642 and may be either synthetic or naturally occurring. Suitable commercial graphite and graphite dispersions contemplated to be useful herein include: Ultrafine Graphite sold by Showa Denko K.K., Tokyo, Japan; Aquadag E sold by Acheson Colloids of Port Huron, Mich.; Micro 440 and Graphite 850, both sold by Asbury Graphite Mills Inc., of Asbury, N.J.; Grafo 1204B, sold by Metal Lubricants Company, Harvey, Ill.; Graphokote, 90, sold by Dixon Products, Lakehurst, N.J., Nippon; AUP (0.7 micron), sold by Nippon Graphite Industries, Ltd., Ishiyama, Japan; Hitasol Ga-66M and 66-S sold by Hitachi Powdered Metals Co., Ltd of Matsudo City, Japan; and others having similar electrical and dispersion characteristics. Synthetic graphite is preferred. Synthetic graphite is formed by heat treating (graphitizing) a carbon source at temperatures exceeding 2400° C.

Another component that may be present in the carbonaceous dispersion is a water soluble or dispersible binding agent to bond the carbon particles to the substrate and to form a coherent coating. The binding agent is believed to assist adhesion of the dispersed carbon particles to the surface of the non-conductive (i.e., dielectric) substrate which is to be made conductive for electroplating. The binding agent may be present as from about 0% to about 15% by weight, and preferably from about 0.2 to about 10% by weight.

The binding agent is preferably a natural or synthetic polymer, polymerizable monomer, or other viscous or solid material (or precursor thereof) that is capable of both adhering to the carbon particles and of receiving an anionic dispersing agent (as described below). For example, the binding agent may be a water soluble or water dispersible material selected from the group consisting of mono- and polysaccharides (or, more broadly, carbohydrates and anionic polymers). Monosaccharide binding agents include tetroses, pentoses, and hexoses. Polysaccharide (including disaccharide and higher saccharides) binding agents include sucrose, maltose, fructose, lactose, stachyose, maltopentose, dextrin, cellulose, corn starch and polysaccharide gums. Polysaccharide gums include agar, arabic, xanthan, pectin, alginate, tragacanath, dextran and other gums. Derivative polysaccharides include cellulose acetates, cellulose nitrates, methylcellulose, and carboxymethylcellulose. Hemi-cellulose polysaccharides include d-gluco-d-mannrans, d-galacto-d-gluco-d-mannans, and others. Anionic polymers include the alkylcelluloses or carboxyalkylcelluloses, their low- and medium-viscosity alkali metal salts (e.g. sodium carboxymethylcellulose, or "CMC"), cellulose ethers, and nitrocellulose.

The acrylics may also be used as binding agents. Typical acrylics include polymerizable monomers and polymers, for example, emulsion polymers commonly known as acrylic latices. The monomers include acrylamide, acrylonitrile, acrylic acid, methacrylic acid, glycidyl methacrylate and others. The acrylic polymers include polymers of any one or more of the foregoing monomers; polyacrylamide polymers; polyacrylic acid; acrylic ester polymers such as polymethyl acrylate, poly-ethyl acrylate, polypropyl acrylate, polyisopropyl acrylate, polybutyl acrylate, polyisobutyl acrylate, polypentyl acrylate, polyhexyl acrylate, polyheptyl acrylate, polyoctyl acrylate, and polyisobornyl acrylate; and other polyacrylates.

Other binding agents may also be used such as vinyl resins including polyvinyl acetates, polyvinyl ethers, polyvinyl chlorides; pyrrolidone resins such as poly(N-vinyl-2-pyrrolidone); polyols such as polyvinyl alcohols and other materials that may be used as binding agents including polyethylenimine, methylaminoethyl resins, alkyltrimethylammonium chlorides, and others. Esters of olefinic alcohols, aminoalkyl esters, esters of ether alcohols, cycloalkyl esters, and esters of halogenated alcohols.

A practical upper limit to the amount of binding agent used is that amount which materially interferes with the conductivity of the resulting conductive coatings by diluting the conductive solids in the composition after it is deposited as a film.

Another component in the dispersion may be a dispersing agent. A dispersing agent has a hydrophobic end and a hydrophilic end. It functions by surrounding the bound carbon particles thereby causing the particles to disperse. It is believed that the hydrophobic end of the dispersing agent is attracted to the hydrophobic region of the binding agent thereby causing the hydrophilic end to stick out into the aqueous surrounding dispersing medium. When each bound carbon particle has sufficient dispersing agent bound to it, the sphere of charges surrounding each particle causes the particles to repel one another thus maintaining the dispersion stable.

The amount of dispersing agent is an amount sufficient to cause the bound carbon particles to disperse in the aqueous dispersing medium. The amount used is dependent upon the size of the carbon particle and the amount of binding agent bound thereto. To determine the amount of dispersing agent required in any particular case, one of ordinary skill in the art can begin by adding ever increasing amounts of dispersing agent to the bound carbon particles until a sufficient amount is added to cause the particles to disperse. This amount of dispersing agent is the minimum effective amount of dispersing agent. Increasing amounts of dispersing agent may be added without adversely affecting the dispersion of the carbon particles. The dispersing agent may be anionic or cationic dependent on the charge of the dispersed phase. To ensure that the particles remain dispersed, one could add a ten percent greater amount of dispersing agent than is needed. For example, the dispersing agent may be present as from about 0% to about 10% by weight, and preferably about 0.01% to about 5% by weight. A practical upper limit to the amount of dispersing agents used is that amount which materially interferes with the conductivity of the resulting conductive coatings by diluting the conductive solids in the composition.

Suitable anionic dispersing agents include -acrylic latices, aqueous solutions of alkali metal polyacrylates, and similar materials.

An optional component of the composition of the present invention is a surfactant. One function of the surfactant is to decrease the surface tension of the aqueous dispersing medium such that the aqueous dispersing medium containing the dispersed carbon particles is able to freely penetrate into the through holes or vias. A second function of the surfactant is to wet the surfaces of the polymeric and glass substrates. This facilitates the coating of these surfaces with the carbon dispersion. The amount of surfactant that is used will vary dependent upon the surfactant itself. When used, the amount of the surfactant may vary from about 0.01 % to about 10% by weight, and preferably in an amount of from about 0.02% to about 3% by weight of the composition.

Another component of the composition is an aqueous dispersing medium. The phrase "aqueous dispersing medium" as used herein includes any solvent that is from 80 to 100% water wherein the balance of the material is a water soluble organic composition. Typical water soluble organic compositions include the low molecular weight alcohols, such as methanol, ethanol, and isopropanol. Additional organic components include solvents such as dimethylsulfoxide, tetrahydrofuran and ethylene or propylene glycol. Preferably, the aqueous dispersing medium is 100% water.

The composition and method of the present invention is capable of being run over a wide pH range such as from about 3.0 to 13.0, but preferably the composition has a pH of from about 8 to 13.0 and more preferably, a pH within the range of 9.0 to 11. Viscosity changes are encountered when the pH of the dispersion is within the acid range. The pH may be maintained by a pH buffer. The buffer functions by precluding or minimizing changes in pH such as may occur during the course of a run where a large number of boards are treated with the carbonaceous composition. The maintenance of a constant or nearly constant pH ensures reproducible results from board to board.

A copper etchant or complexing agent compatible at the pH of the carbonaceous dispersion is also desirably added to the dispersion so that in use, the copper cladding may be etched simultaneously with the formation of the graphite coating. Copper etchants and complexing agents suitable for use within the useful pH range are known in the art and disclosed in numerous publications. A preferred class of materials are those materials used as complexing agents in electroless copper plating solutions. Such materials are disclosed in numerous prior publications including U.S. Pat. Nos. 3,728,137 and 3,790,392 incorporated herein by reference. Such materials include, by way of example, Rochelle salts, the sodium salts of ethylenediamine tetraacetic acid, nitrolotriacetic acid and its alkali metal salts, triethanolamine, modified ethylenediamine tetraacetic acids such as N-hydroxyethylene diamine triacetate, hydroxyalkyl substituted dialkaline triamines such as pentahydroxypropyldiethylenetriamine and the like. One preferred class of amines are the hydroxyalkyl substituted tertiary amines such as tetrahydroxypropylethylene diamine, pentahydroxypropyl diethylene triamine, trihydroxypropyl amine, trihydroxypropyl hydroxyethylethylene diamine and the like. Another suitable class of materials are those materials used as relatively mild copper etchants, especially the amine based etchants. Such etchants are known in the art and disclosed in numerous publications including U.S. Pat. Nos. 3,837,945 and 4,280,887, incorporated herein by reference. Such materials include, by way of example, ammonia and ammonium salts such as tetraamine cupric and cuprous salts and ammoniacal peroxy compounds as disclosed in the aforesaid patents. Quaternary ammonium hydroxides such as tetramethyl and tetraethyl ammonium hydroxide are also useful as etchants. Aggressive etchants such as ferric chloride and chromic/sulfuric etchants are generally undesired for purposes of this invention. Preferably, the material used to add to the carbonaceous dispersion is one that is capable of complexing with the copper cladding to theoretically remove only the top monolayer of the copper cladding. However, for purposes of the invention, the dissolution agent is one that should be of a strength sufficient to etch from about 0.01 to 50 microinches of copper and preferably, from 0.1 to 1.0 microinches of copper during that period of time that the carbonaceous coating material is in contact with the copper. Obviously, in addition to the selection of the dissolution agent, the depth of penetration of the dissolution agent is controlled by pH, concentration, temperature and the amount of dissolved copper in the formulation.

The etchant is added to the dispersion in an amount sufficient to etch copper as described above. Preferably, the etchant is used in an amount of from about 0.1 to 10 percent by weight of the dispersion and more preferably, in an amount of from 0.5 to 5 percent by weight of the dispersion.

In accordance with a preferred embodiment, the etchant is ammonium hydroxide as ammonium hydroxide provides adequate removal of copper ions from the surface of the cladding and may be used for close pH control.

The carbonaceous dispersion is used in conventional manner. Using a copper clad substrate having apertures therein for purposes of illustration, the board would be cleaned, rinsed, treated with a neutralizer conditioner in accordance with the invention, and then treated with the dispersion. The dispersion would be applied to the substrate to form a wet coating. Thereafter, the coating would be dried to remove the dispersant, and in some processes but not all, fixed though this step does not appear to be critical. The carbonaceous coating would then be removed from metallic copper surfaces facilitated by the step of simultaneously etching the copper with the dispersion during the formation of the carbonaceous coating. For this reason, the carbonaceous coating may be removed without an additional etching or other chemical treatment step if desired. For example, pressure spraying may be used to remove the carbonaceous coating without a step of etching the copper though an optional etching step may be used in the process if desired.

Following formation of the carbonaceous coating and removal of the same from copper surfaces, the part is ready for electroplating. The electroplating procedure is conventional. The part to be plated is used as a cathode in a conventional electroplating cell. Current density is conventional and varies typically within a range of from 10 through 80 amps/ft.$^2$. In practice, it is convenient to initiate current flow as the part enters the plating solution. A preferred current density range is from 15 to 30 amps/ft.$^2$. The plating solution is maintained at a temperature ranging between room temperature and about 40° C. Plating is continued for a time sufficient to form a deposit of desired thickness. For circuit board manufacture, a desired thickness may range between 0.5 and 2.0 mils, typically from 1 to 1.5 mils. A plating time of from 15 to 120 minutes is typically required to obtain a deposit of the preferred thickness within the preferred range of current densities. The deposit formed by the process is uniform in thickness, free of defects and strongly bonded to the surface of the nonconductor over which it is plated. Bond strength is satisfactory to withstand solder shock testing as conventionally used in printed circuit board manufacture.

EXAMPLE 1

A dispersion is prepared by providing a preformed graphite dispersion obtained from Acheson Chemical Company and identified as Aquadag E. This dispersion contains about 3.0 percent by weight particulate graphite having a mean particle size of about 1 micron. The pH of the dispersion is adjusted to 10.5 by addition of ammonium hydroxide which functions as an etchant for copper and as a pH adjustor.

EXAMPLE 2

The following example illustrates the manner in which a printed circuit board substrate may be electroplated in accordance with the procedures of this invention. All proprietary chemicals identified in the example are available from Shipley Company, L.L.C. of Marlborough, Mass.

A multilayer circuit board having 4 internal and 2 external circuit layers with an array of 14 and 36 mil. holes may be subjected to the following procedure.

Step 1 Pre-clean and condition:

a. immerse in an aqueous alkaline solution of an organic epoxy solvent identified as Circuposit Conditioner 3302 at 70° C. mean temperature for 10 minutes and water rinse;

b. desmear the hole walls with a proprietary permanganate solution identified as MLB Promoter 3308 at a mean temperature of 70° C. for 10 minutes and water rinse;

c. neutralize residues and charge modify by treatment with a single treatment solution having the following formulation at 48° C. for 5 minutes and water rinse following treatment:

| | |
|---|---|
| hydroxyl ammonium nitrate (18% solution) | 54 grams per liter |
| methane sulfonic acid (70% solution) | 137 grams per liter |
| surfactant[1] | 5 grams per liter |
| polyelectrolyte[2] | 10 grams per liter |
| water | to 1 liter |

[1]Triton X 102 available from Union Carbide, an octylphenoxypolyethoxy ethanol containing 12 to 13 moles of ethylene oxide.
[2]IPC 6660 available from Chemlink Industrial, a Division of Baker Performance Chemicals, Inc., an acylamide-diallyldimethylammonium chloride copolymer.

Step 2 Form conductive particle coating:

a. apply the carbonaceous dispersion of Example 1 to the substrate by contact of the substrate with the dispersion in a submerged spray mode for 5 minutes at room temperature;

b. dry the coating on the substrate by placing the substrate in an air circulating oven maintained at 75° C. for 20 minutes.

Step 3 Microetch copper surfaces and remove dispersion coating from copper cladding.

Spray the board with water at a pressure of about 20 lbs./in$^2$ for 1 minute. Inspection of the copper cladding will reveal that the dispersion coating has been removed from the surface leaving a clean copper surface available for metal plating.

Step 4 Electroplate:

Electroplate copper from an acid copper electroplating bath identified as Electroposit 272 acid copper at a current density of 20 amps./ft.$^2$ and at a temperature of 20° C. for 1 hour and 40 minutes and water rinse to obtain a deposit having a thickness of about 1.5 mils.

Following the above procedure, the number of interconnect defects was less than 1 percent.

EXAMPLE 3

Repeat the procedure of Example 2 separating Step 1 c. into two steps using a separate reducing solution and charge modification solution. The reducing solution is identified as Neutralizer 3314 and has the following composition:

| | |
|---|---|
| p-toluene sulfonic acid | 10 grams per liter |
| sulfuric acid (50% solution) | 165 grams per liter |
| hydrochloric acid (37% solution) | 1 gram per liter |
| surfactant[1] | 5 grams per liter |
| hydrogen peroxide (35% solution)[2] | 50 grams per liter |
| water | to 1 liter |

[1]Triton X 55 available from Union Carbide, an anionic phospate ester.
[2]Hydrogen peroxide functions as a reducing agent in acid solution.

The charge modification solution is identified as Sensitizer 2010 and has the following composition:

| | |
|---|---|
| potassium carbonate, anhydrous | 7.00 grams per liter |
| hydrochloric acid (37% solution) | 0.01 grams per liter |
| surfactant[1] | 1.50 grams per liter |
| polyelectrolyte[2] | 6.00 grams per liter |

[1]Triton QS-15 available from Union Carbide, an oxyethylated alklyl phenoxy ethanol.
[2]Nalco 8020, available from Nalco Chemical Company, a polyamino ether salt.

Following the above procedure, the number of interconnect defects was determined and found to be about 30.5 percent.

What is claimed is:

1. A process for metallizing the walls of holes within a printed circuit board substrate having metallic and non-metallic regions, said process comprising the steps of treating the printed circuit board substrate with a single aqueous acid solution containing a hydroxyl ammonium reducing agent and an amine polyelectrolyte, contacting the so treated surface with an aqueous dispersion of carbonaceous particles to form a coating of said dispersion over all surfaces of said substrate and electroplating metal on said substrate from an electrolytic metal plating solution, where the aqueous acid solution has a pH varying between 0 and 2.5.

2. The process of claim 1 where the pH varies between 0.5 and 1.5.

3. The process of claim 1 where the hydroxyl ammionium reducing agent is hydroxyl ammonium nitrate.

4. The process of claim 1 where the polyelectrolyte is a polyquaternary amine.

5. The process of claim 1 where the solution contains a sulfonic acid.

6. The process of claim 1 where the carbonaceous particles are in the form of graphite.

7. A process for metallizing the walls of holes within a printed circuit board substrate having metallic and non-metallic regions, said process comprising the steps of treating the printed circuit board substrate with a single aqueous acid solution containing a hydroxyl ammonium reducing agent and an mine polyelectrolyte, contacting the so treated surface with an aqueous dispersion of carbonaceous particles to form a coating of said dispersion over all surfaces of said substrate and electroplating metal on said substrate from an electrolytic metal plating solution, where the solution contains a surfactant.

8. A process for mnetallizing the walls of holes within a printed circuit board having metallic and non-metallic regions, the process comprising treating the printed circuit board with a single aqueous solution with a single aqueous acid solution containing a hydroxyl ammonium reducing agent and an amine polyelectrolyte, contacting the treated substrate with an aqueous dispersion of carbonaceous particles to form a coating of the dispersion over the substrate and electroplating metal on the substrate from an electrolytic metal plating solution, where the hydroxyl ammonium reducing agent is hydroxyl ammonium nitrate.

9. The process of claim 8 where the carbonaceous particles are in the form of graphite.

* * * * *